(12) United States Patent
Wang et al.

(10) Patent No.: US 9,202,746 B2
(45) Date of Patent: Dec. 1, 2015

(54) INTEGRATED CIRCUITS WITH IMPROVED GAP FILL DIELECTRIC AND METHODS FOR FABRICATING SAME

(71) Applicant: GLOBALFOUNDRIES Singapore Pte. Ltd., Singapore (SG)

(72) Inventors: Lei Wang, Singapore (SG); Lup San Leong, Singapore (SG); Wei Lu, Singapore (SG); Alex See, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 23 days.

(21) Appl. No.: 14/145,581

(22) Filed: Dec. 31, 2013

(65) Prior Publication Data

US 2015/0187641 A1  Jul. 2, 2015

(51) Int. Cl.
  *H01L 21/3205* (2006.01)
  *H01L 29/78* (2006.01)
  *H01L 21/768* (2006.01)
  *H01L 21/02* (2006.01)
  *H01L 23/522* (2006.01)

(52) U.S. Cl.
  CPC .... *H01L 21/76819* (2013.01); *H01L 21/02164* (2013.01); *H01L 21/02216* (2013.01); *H01L 21/02274* (2013.01); *H01L 21/76805* (2013.01); *H01L 21/76879* (2013.01); *H01L 23/5226* (2013.01)

(58) Field of Classification Search
  CPC ............... H01L 21/823864; H01L 21/823814; H01L 21/76805
  USPC .......................................... 438/595; 257/333
  See application file for complete search history.

(56) References Cited

U.S. PATENT DOCUMENTS

| | | | |
|---|---|---|---|
| 2008/0248649 A1* | 10/2008 | Adetutu et al. | 438/692 |
| 2012/0104471 A1* | 5/2012 | Chang et al. | 257/288 |
| 2013/0032888 A1* | 2/2013 | Murata | 257/369 |

* cited by examiner

*Primary Examiner* — Caridad Everhart
(74) *Attorney, Agent, or Firm* — Ingrassia Fisher & Lorenz, P.C.

(57) ABSTRACT

Integrated circuits with reduced shorting and methods for fabricating such integrated circuits are provided. In an embodiment, a method for fabricating an integrated circuit includes depositing a gap fill dielectric overlying a semiconductor substrate. The gap fill dielectric is formed with an upper surface having a height differential. The method includes reducing the height differential of the upper surface of the gap fill dielectric. Further, the method includes depositing an interlayer dielectric overlying the gap fill dielectric. Also, the method forms an electrical contact to a selected location overlying the semiconductor substrate.

20 Claims, 6 Drawing Sheets

US 9,202,746 B2

INTEGRATED CIRCUITS WITH IMPROVED GAP FILL DIELECTRIC AND METHODS FOR FABRICATING SAME

TECHNICAL FIELD

The technical field generally relates to integrated circuits and methods for fabricating integrated circuits, and more particularly relates to integrated circuits formed with gate structures surrounded by gap fill dielectric and methods for fabricating such integrated circuits using gap fill dielectric having reduced topology variation.

BACKGROUND

Generally, integrated circuits comprise semiconductor devices, such as transistors, capacitors, and the like, formed on and within a wafer. The trend in the semiconductor industry is towards the miniaturization or scaling of integrated circuits, in order to provide smaller integrated circuits and improved performance, such as increased speed and decreased power consumption.

Conventionally, a gap fill dielectric material is deposited over semiconductor devices after their formation in front-end-of-line (FEOL) processing. An interlayer dielectric material is then formed over the gap fill material before contacts and interconnect structures are formed. Typically, the gap fill dielectric material is a silicon oxide deposited by a high aspect ratio polymer (HARP) process. Further, the interlayer dielectric material is often a silicon oxide deposited by a plasma-deposition process from tetraethoxysilane (TEOS). These two dielectric materials have different removal rates for the conventionally used chemical mechanical planarization (CMP) processes and the reactive ion etch (RIE) processes in integrated circuit fabrication. Further, the HARP oxide typically is formed with a large topology variation, particularly evident where the HARP oxide lies over gate structures. As a result of the topology variation and etch rate differences, conventional processing using RIE processes after CMP processes often leads to an undesirable etching of HARP oxide material underlying TEOS oxide material, and can result in dishing, electrical shorting, and metal line collapse. These defects can lead to load yield for fabrication processes and increased costs.

Accordingly, it is desirable to provide integrated circuits and methods for fabricating integrated circuits having improved gap fill dielectric and improved electrical performance. It is further desirable to provide integrated circuits and methods suitable for fabricating integrated circuits in which the risk of defect generation is minimized and the fabrication is cost effective. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits with improved gap fill material are provided. In accordance with an exemplary embodiment, a method for fabricating an integrated circuit includes depositing a gap fill dielectric overlying a semiconductor substrate. The gap fill dielectric is formed with an upper surface having a height differential. The method includes reducing the height differential of the upper surface of the gap fill dielectric. Further, the method includes depositing an interlayer dielectric overlying the gap fill dielectric. Also, the method forms an electrical contact to a selected location overlying the semiconductor substrate.

In accordance with another embodiment, a method for fabricating an integrated circuit includes providing a semiconductor substrate with gate structures formed thereon. The method deposits a gap fill dielectric overlying the gate structures and the semiconductor substrate. The method also planarizes the gap fill dielectric such that the gap fill dielectric remains covering the gate structures. The method includes depositing an interlayer dielectric overlying the gap fill dielectric. Further, the method includes forming an electrical contact to a selected gate structure.

In another embodiment, an integrated circuit is provided and includes a semiconductor substrate and a gate structure overlying the semiconductor substrate. The integrated circuit further includes a gap fill dielectric overlying the gate structure and the semiconductor substrate and an interlayer dielectric overlying the gap fill dielectric. The integrated circuit further includes a conductive contact in electrical contact with the gate structure. The conductive contact extends through and is in physical contact with the interlayer dielectric and the gap fill dielectric.

BRIEF DESCRIPTION OF THE DRAWINGS

Embodiments of methods for fabricating integrated circuits with improved gap fill dielectric will be described in conjunction with the following drawing figures, wherein like numerals denote like elements, and wherein.

DETAILED DESCRIPTION

Figure 1:
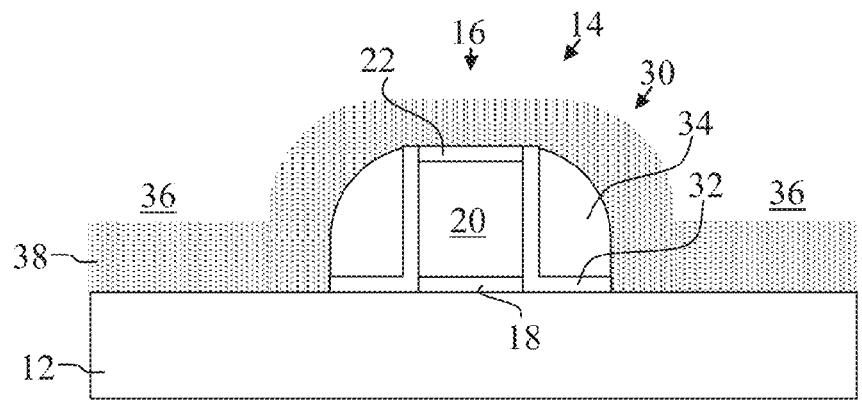
FIG. 1-8 illustrate, in cross section, a portion of an integrated circuit and method steps for fabricating an integrated circuit with improved gap fill dielectric in accordance with an exemplary embodiment.

The following detailed description is merely exemplary in nature and is not intended to limit the various embodiments of the integrated circuits or the methods for fabricating integrated circuits claimed herein. Furthermore, there is no intention to be bound by any expressed or implied theory presented in the preceding technical field, background or brief summary, or in the following detailed description. Also, additional components may be included in the integrated circuits, and additional processes may be included in the fabrication methods but are not described herein for purposes of clarity. For the purposes of explanation, numerous specific details are set forth in order to provide a thorough understanding of exemplary embodiments. It should be apparent, however, that exemplary embodiments may be practiced without these specific details or with an equivalent arrangement.

Integrated circuits and methods for fabricating integrated circuits using improved gap fill dielectric as described herein provide for improved electrical performance as compared to conventional methods. For example, in conventional integrated circuit fabrication processes, interlayer dielectric material typically is deposited over gap fill dielectric material formed over a semiconductor substrate and typically has large topology variation. A planarization process is then performed. This planarization processing frequently, though undesirably, exposes the underlying gap fill dielectric material. Thereafter, vias are etched through the dielectric layers to form contacts to underlying semiconductor devices. When the underlying gap fill dielectric material is exposed before the via etch, etch rate differences prevent the resulting vias from being formed with the desired shape and may lead to electrical shorting after contact structures are formed in the vias. Further, when the exposure of the underlying gap fill dielectric material is non-uniform across the semiconductor substrate, the integrated circuit is formed with contact structures having different electrical characteristics, leading to performance issues.

In the methods described herein, the topology variation of the gap fill dielectric is reduced before the interlayer dielectric is deposited. Therefore, exposure of the gap fill dielectric by the planarization process is inhibited. Further, the via etch process results in formation of vias with the desired shape, depth and the desired spacing between contact structures. As a result, electrical performance and device uniformity of the integrated circuit may be improved.

FIGS. 1-15 illustrate steps in accordance with various embodiments of methods for fabricating integrated circuits. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Referring to FIG. 1, in an exemplary embodiment, a method for fabricating an integrated circuit 10 begins by providing a semiconductor substrate 12 that may be bulk semiconductor material or a silicon on insulator (SOI) wafer including a semiconductor material overlying a silicon oxide layer. While the semiconductor material is preferably a silicon material, the term "silicon material" is used herein to encompass the relatively pure silicon materials typically used in the semiconductor industry as well as silicon admixed with other elements. Alternatively, the semiconductor material can be realized as germanium, gallium arsenide, and the like, or may include a compound semiconductor such as, silicon carbide, gallium arsenide, indium arsenide, or indium phosphide. Further, the semiconductor substrate 12 may optionally include an epitaxial layer (epi layer), and/or may be strained for performance enhancement. Further, the semiconductor substrate 12 may be formed into fin structures for use in FinFETs.

As shown, a semiconductor device 14, such as a transistor, is formed overlying the semiconductor substrate 12 during typical front-end-of-line (FEOL) processing. The exemplary semiconductor device 14 includes a gate structure 16 including a gate dielectric layer 18, a gate electrode 20 and a gate cap 22. Further, a spacer structure 30 surrounds the gate structure 16. The exemplary spacer structure 30 includes an inner spacer 32 and an outer spacer 34. As is typical, the semiconductor device 14 is separated from adjacent devices (not shown) formed on the semiconductor substrate 12 by gaps 36. In FIG. 1, an optional liner 38 may be formed overlying the semiconductor substrate 12 and the semiconductor device 14. For example, the optional liner 38 may be a stress-inducing layer, such as silicon nitride or another suitable material.

Figure 2:
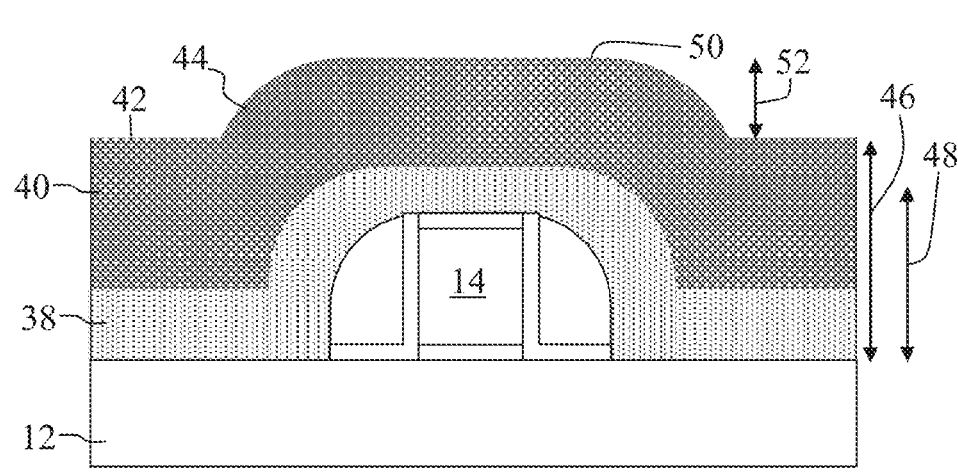

In FIG. 2, a gap fill dielectric material 40 is deposited over the semiconductor device 14 and semiconductor substrate 12. The gap fill dielectric material 40 may be formed by chemical vapor deposition (CVD), spin-on, sputtering, or other suitable methods. The gap fill dielectric material 40 may include silicon oxide, silicon oxynitride, or a suitable low-k material, i.e., a material having a dielectric constant of less than 3.9. In an exemplary embodiment, the gap fill dielectric material 40 is silicon oxide. An exemplary silicon oxide is deposited by a high aspect ratio polymer (HARP) process.

As shown, the gap fill dielectric material 40 completely fills the gaps 36 (shown in FIG. 1) adjacent the semiconductor device 14. Specifically, the gap fill dielectric material 40 includes a base portion 42 having a height, indicated by double headed arrow 46, that is greater than a height, indicated by doubled headed arrow 48, of the semiconductor device 14 (including the liner 38 if present). Further, the exemplary gap fill dielectric material 40 includes a raised portion 44 overlying the semiconductor device 14. As a result, the exemplary gap fill dielectric material 40 is formed with an upper surface 50 having a non-planar topology with a height differential, indicated by double headed arrow 52, between the base portion 42 and the raised portion 44.

Figure 3:
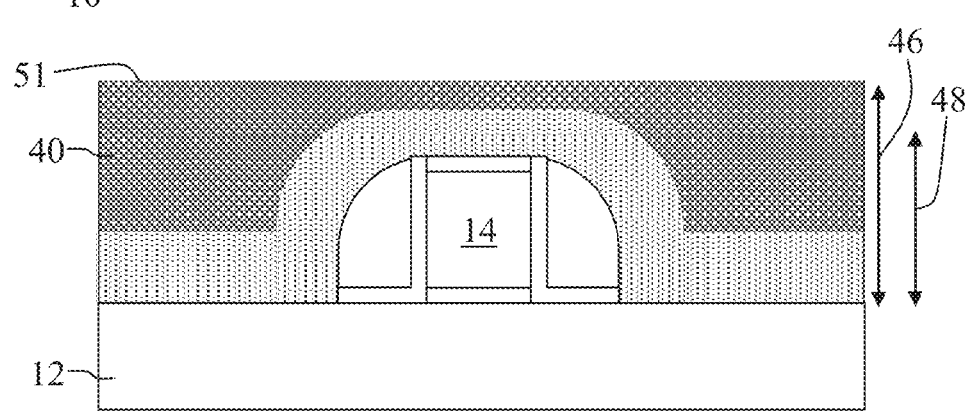

In the exemplary embodiment of FIG. 3, the height differential 52 of the upper surface 50 of the gap fill dielectric material 40 is reduced. Specifically, the gap fill dielectric material 40 is planarized, such as by chemical mechanical planarization (CMP), to completely remove the raised portion 44 of the gap fill dielectric material 40 and to substantially reduce the height differential of the upper surface 50 of the gap fill dielectric material 40 to zero. As a result, the exemplary gap fill dielectric material 40 is provided with a continuous and substantially planar upper surface 51. In the exemplary embodiment, the height 46 of the gap fill dielectric material 40 remains greater than the height 48 of the semiconductor device 14 after planarization.

Figure 4:
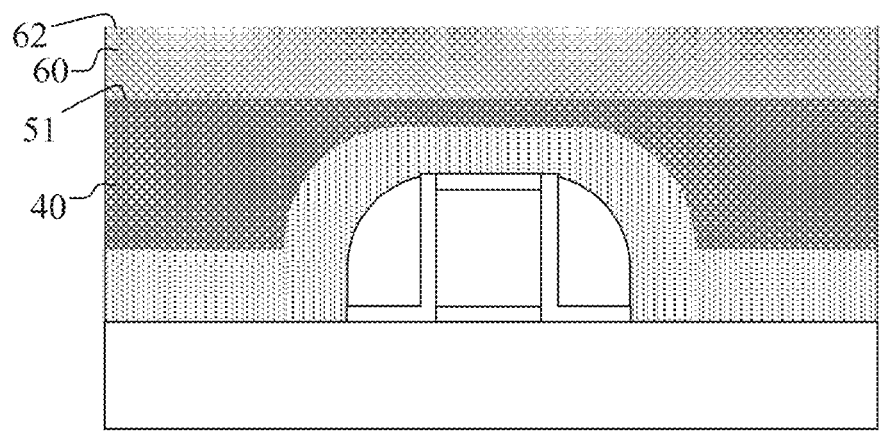

The illustrated method may continue as in FIG. 4 with the deposition of an interlayer dielectric material 60 overlying the gap fill dielectric material 40. As shown, the interlayer dielectric material 60 is blanket deposited over the upper surface 51 of the gap fill dielectric material 40. The interlayer dielectric material 60 is formed with a substantially planar upper surface 62. In an exemplary embodiment, the interlayer dielectric material 60 is silicon oxide. Further, in an exemplary embodiment, the interlayer dielectric material 60 is deposited via a plasma-deposition process using tetraethoxysilane (TEOS).

Figure 5:
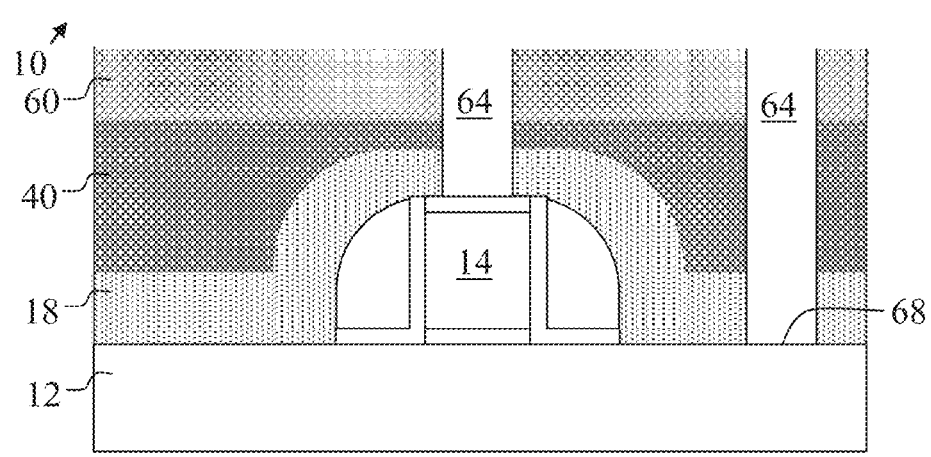

After formation of the interlayer dielectric material 60, an anisotropic etching process is performed, as illustrated in FIG. 5, for the formation of electrical contacts. For example, a reactive ion etch (RIE) is used to form vias 64 that extend through the interlayer dielectric material 60, through the gap fill dielectric material 40, and through the liner 38, if present, to expose selected locations for contacts, such as the gate structure 14 and a source/drain contact region 68 on the semiconductor substrate 12. An exemplary RIE process includes using a hydrofluoric (HF) acid etchant, though any suitable anisotropic etchant chemistry may be used.

Figure 6:
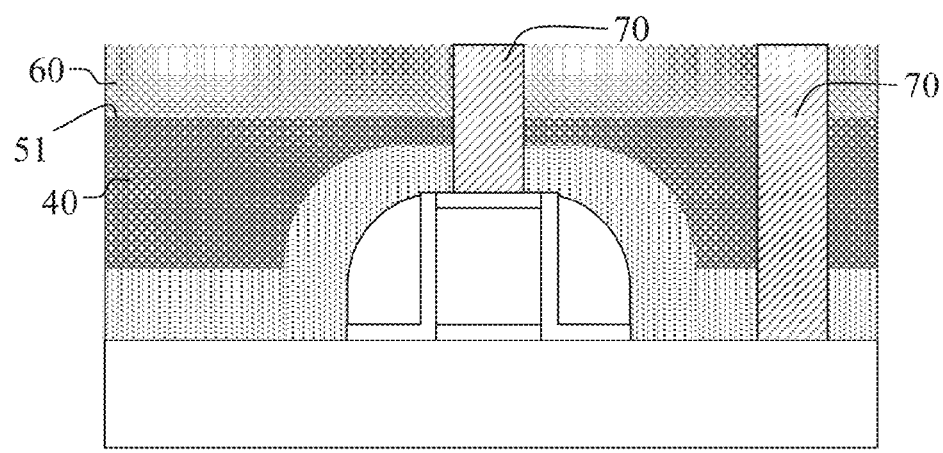

In FIG. 6, the exemplary process continues with the formation of conductive contact structures 70 in the vias 64. Specifically, a conductive material, such as tungsten or another suitable metal, is conformally deposited over the partially completed integrated circuit 10 and fills the vias 64. An overburden portion of the conductive material is typically formed over the interlayer dielectric material 60 and is removed, such as by a CMP process. The conductive material remaining after removal of the overburden forms the conductive contact structures 70. As shown, the overburden removal process does not expose the gap fill dielectric material 40. Rather, the interlayer dielectric material 60 remains overlying the gap fill dielectric material 40 along the upper surface 51 of the gap fill dielectric material 40.

Figure 7:
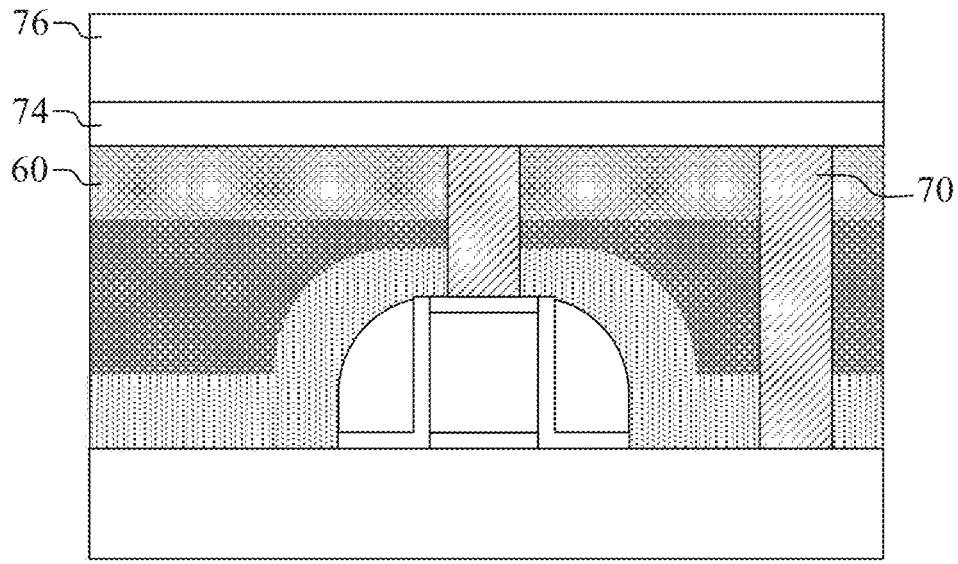

The exemplary method may continue in FIG. 7 with the deposition of additional dielectric material over the conductive contact structures 70. For example, an etch stop layer 74 is deposited over the interlayer dielectric material 60 and the conductive contact structures 70. An exemplary etch stop layer 74 is a silicon carbide nitride (SiCN). In an exemplary embodiment, the etch stop layer 74 is deposited by chemical vapor deposition (CVD).

An additional interlayer dielectric material 76 is deposited over the partially completed integrated circuit 10. As shown, the interlayer dielectric material 76 is formed over the etch stop layer 74. An exemplary interlayer dielectric material 76 is carbon-doped silicon oxide (SiCOH). In an exemplary embodiment, the interlayer dielectric material 76 is deposited by plasma-enhanced chemical vapor deposition (PECVD).

Figure 8:
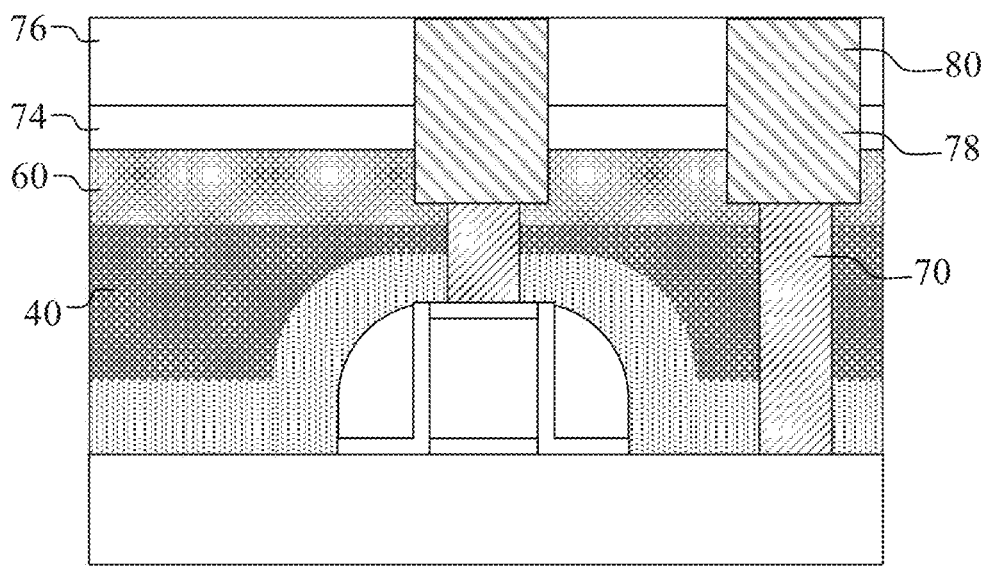

In FIG. 8, an anisotropic etching process is performed for the formation of interconnect structures. For example, a reactive ion etch (RIE) is used to form trenches 78 that extend through the interlayer dielectric material 76, through the etch stop layer 74 and into the interlayer dielectric material 60 and contact structures 70. The RIE process may include sequential etches including an etch selective to the interlayer dielectric material 76 that stops on the etch stop layer 74, an etch selective to the etch stop layer 74, and a timed etch for etching into the interlayer dielectric material 60 and the contact structures 70.

FIG. 8 further illustrates the formation of conductive interconnect structures 80 in the trenches 78. A conductive material, such as copper or another suitable metal, is conformally deposited over the partially completed integrated circuit 10 and fills the trenches 78. An overburden portion of the conductive material is typically formed over the interlayer dielectric material 76 and is removed, such as by a CMP process. The remaining conductive material forms the conductive interconnect structures 80.

The dielectric material deposition, contact formation, and interconnect formation processes of FIGS. 3-8 result in the structure of the partially fabricated integrated circuit 10 of FIG. 8. Further processing, such as the formation of additional interlayer dielectric and interconnect structures may be performed on the partially fabricated integrated circuit 10. In the method described in FIGS. 3-8, the topological height differential of the gap fill dielectric material 40 is substantially reduced to zero, i.e., the raised portion 44 of the gap fill dielectric material 40 is removed. FIGS. 9-15 describe an alternate embodiment in which the raised portion 44 of the gap fill dielectric material 40 is recessed but not removed.

Figure 9:
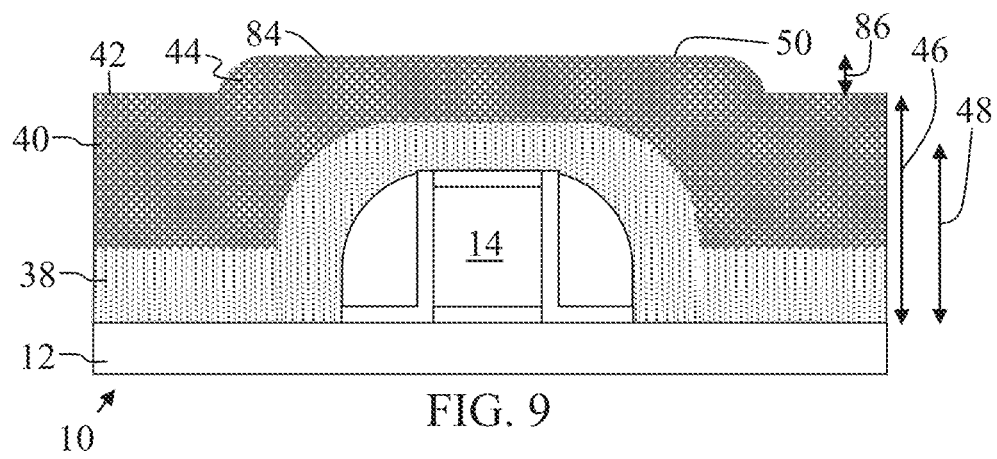
FIGS. 9-15 illustrate, in cross section, a portion of an integrated circuit and method steps for fabricating an integrated circuit with improved gap fill dielectric in accordance with an alternate embodiment.

The method with reference to FIGS. 9-15 begins with the gap fill dielectric material 40 lying over the liner 38, semiconductor device 14, and semiconductor substrate of the partially completed integrated circuit 10 as provided in FIG. 2. In FIG. 9, the gap fill dielectric material 40 is planarized, such as by CMP, to partially remove the raised portion 44. The planarization process forms a recessed segment 84 of the upper surface 50 across the raised portion 44 of the gap fill dielectric material 40. As a result, the upper surface 50 has a reduced height differential, indicated by double headed arrow 86, between the raised portion 44 and the base portion 42. The reduced height differential is less than height differential 52 of FIG. 2. Therefore, the exemplary gap fill dielectric material 40 is provided with an upper surface 50 having a topology with a reduced height variation. Further, as the base portion 42 of the gap fill dielectric material 40 is not planarized, the height 46 of the gap fill dielectric material 40 remains greater than the height 48 of the semiconductor device 14 after planarization of the raised portion 44.

Figure 10:
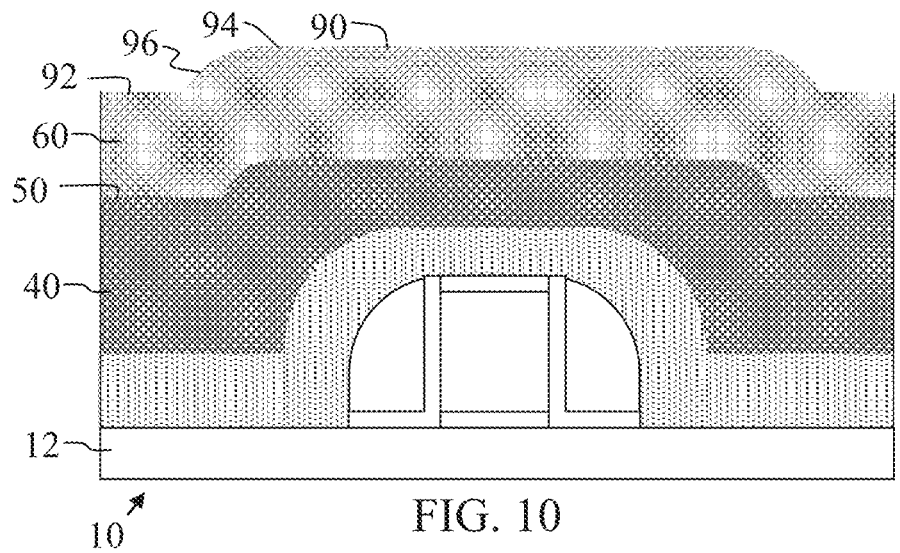

The process of FIGS. 9-15 may continue as shown in FIG. 10 with the deposition of the interlayer dielectric material 60 overlying the gap fill dielectric material 40. As shown, the interlayer dielectric material 60 is conformally blanket deposited over the upper surface 50 of the gap fill dielectric material 40. Conformal deposition of the interlayer dielectric material 60 results in the formation of an upper surface 90 of the interlayer dielectric material 60 that is not planar. Specifically, the interlayer dielectric material 60 has an upper surface 90 with a substantially planar base portion 92 and a substantially planar raised portion 94 interconnected by a sloping portion 96. In an exemplary embodiment, the interlayer dielectric material 60 is silicon oxide. Further, in an exemplary embodiment, the interlayer dielectric material 60 is deposited via a plasma-deposition process using tetraethoxysilane (TEOS).

Figure 11:
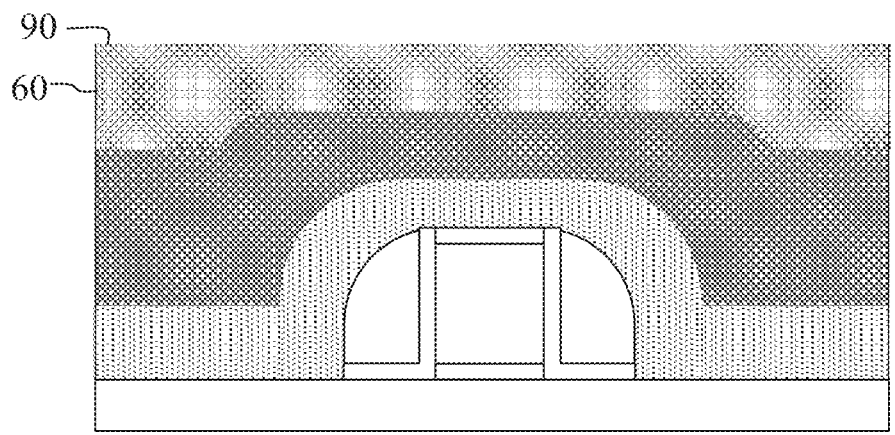

In FIG. 11, the exemplary process continues with planarizing the interlayer dielectric material 60, such as by CMP. As a result of the planarization process, the raised portion 94 and the sloping portion 96 of the upper surface 90 of the interlayer dielectric material 60 are removed and the upper surface 90 of the interlayer dielectric material 60 is substantially planar.

Figure 12:
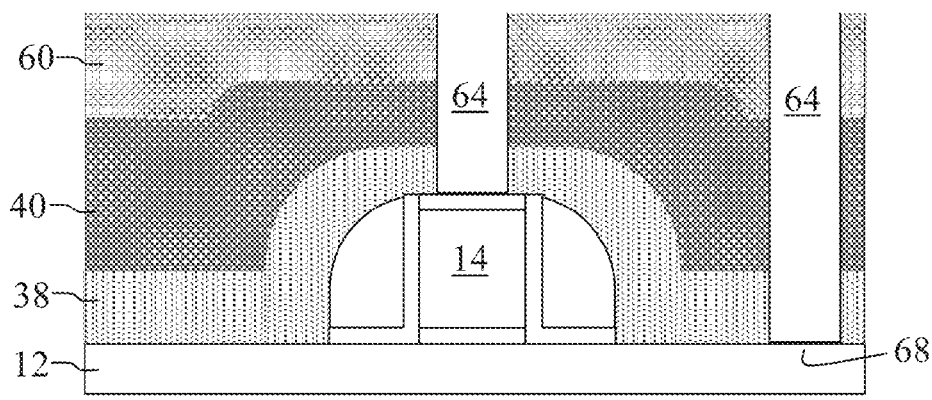

In the exemplary embodiment and as shown in FIG. 12, an anisotropic etching process is then performed for the formation of electrical contacts. For example, a reactive ion etch (RIE) is used to form vias 64 that extend through the interlayer dielectric material 60, through the gap fill dielectric material 40, and through the liner 38, if present, to expose selected locations for contacts, such as the gate structure 14 and a source/drain contact region 68 on the semiconductor substrate 12. An exemplary RIE process includes using a hydrofluoric (HF) acid etchant, though any suitable anisotropic etchant chemistry may be used.

Figure 13:
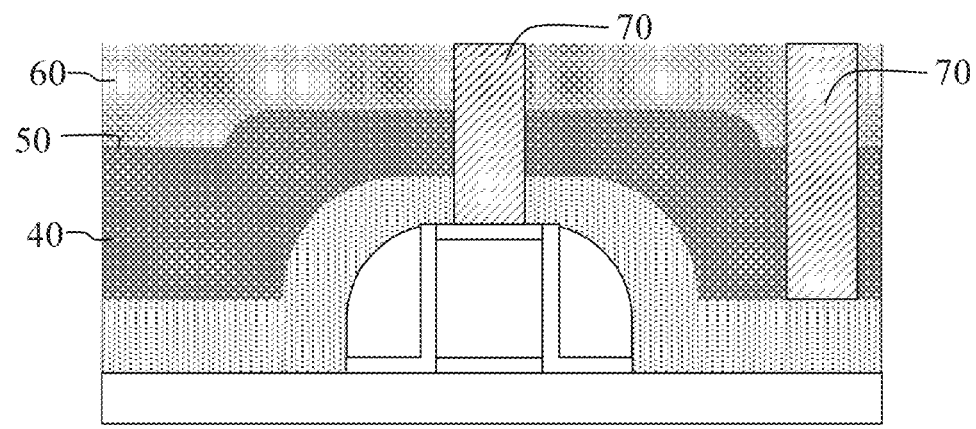

In FIG. 13, the exemplary process continues with the formation of conductive contacts 70 in the trenches 64. Specifically, a conductive material, such as tungsten or another suitable metal, is conformally deposited over the partially completed integrated circuit 10 and fills the trenches 64. An overburden portion of the conductive material is typically formed over the interlayer dielectric material 60 and is removed, such as by a CMP process. As shown, the overburden removal process does not expose the gap fill dielectric material 40. Rather, the interlayer dielectric material 60 remains overlying the gap fill dielectric material 40 along the upper surface 50 of the gap fill dielectric material 40.

Figure 14:
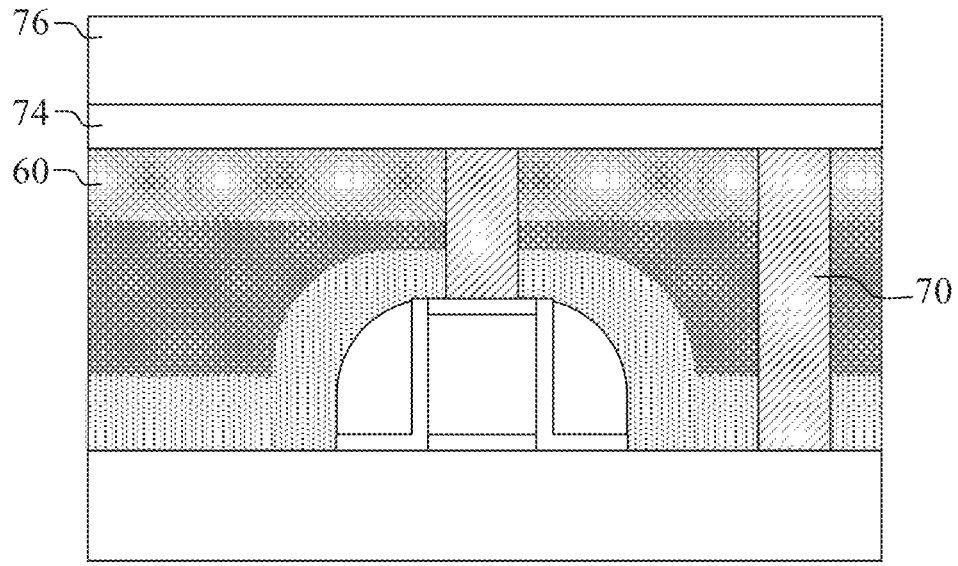
Figure 15:
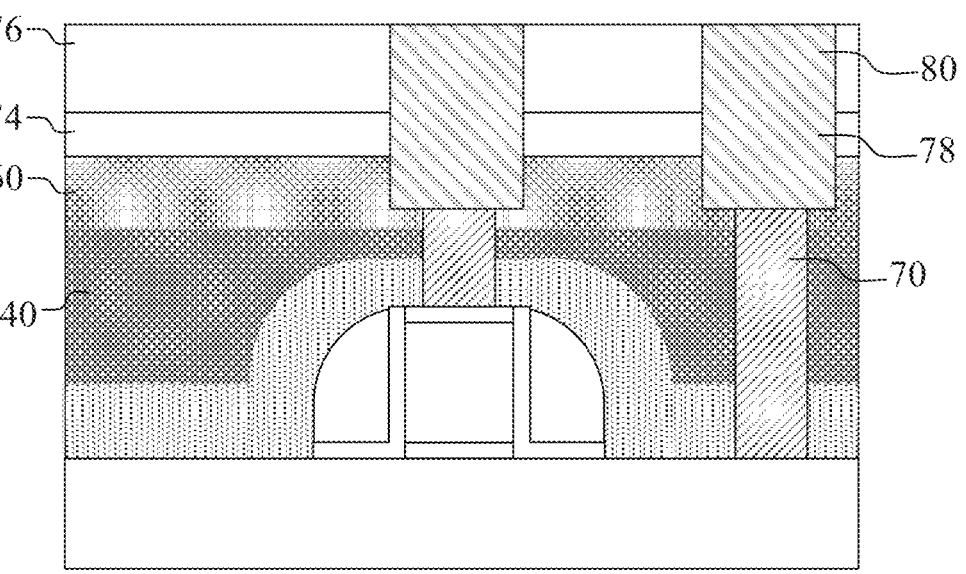

FIGS. 14 and 15 further illustrate the process of providing electrical interconnection to the contact structures 70. In FIG. 14, additional dielectric material is deposited over the conductive contact structures 70. For example, an etch stop layer 74 is deposited over the interlayer dielectric material 60 and the conductive contact structures 70. An exemplary etch stop layer 74 is a silicon carbide nitride (SiCN). In an exemplary embodiment, the etch stop layer 74 is deposited by chemical vapor deposition (CVD). An additional interlayer dielectric material 76 is further deposited over the partially completed integrated circuit 10. As shown, the interlayer dielectric material 76 is formed over the etch stop layer 74. An exemplary interlayer dielectric material 76 is carbon-doped silicon oxide (SiCOH). In an exemplary embodiment, the interlayer dielectric material 76 is deposited by plasma-enhanced chemical vapor deposition (PECVD).

In FIG. 15, an anisotropic etching process is performed for the formation of interconnect structures. For example, a reactive ion etch (RIE) is used to form trenches 78 that extend through the interlayer dielectric material 76, through the etch stop layer 74 and into the interlayer dielectric material 60 and contact structures 70. The RIE process may include sequential etches including an etch selective to the interlayer dielectric material 76 that stops on the etch stop layer 74, an etch selective to the etch stop layer 74, and a timed etch for etching into the interlayer dielectric material 60 and the contact structures 70.

FIG. 15 further illustrates the formation of conductive interconnect structures 80 in the trenches 78. A conductive material, such as copper or another suitable metal, is conformally deposited over the partially completed integrated circuit 10 and fills the trenches 78. An overburden portion of the conductive material is typically formed over the interlayer dielectric material 76 and is removed, such as by a CMP process. The remaining conductive material forms the conductive interconnect structures 80.

Accordingly, integrated circuits and methods for fabricating integrated circuits with improved gap fill dielectric have been described. The exemplary gap fill dielectric is herein provided with a reduced topology variation that inhibits undesirable etching of the gap fill dielectric underlying the interlayer dielectric. The methods described inhibit electrical shorting and provide for uniform electrical connections across the semiconductor substrate.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application

What is claimed is:

1. A method for fabricating an integrated circuit, the method comprising:
   depositing a gap fill dielectric overlying a semiconductor substrate, wherein the gap fill dielectric is formed with a raised portion and a base portion and with an upper surface having a height differential between the raised portion and the base portion;
   reducing the height differential of the upper surface of the gap fill dielectric by recessing the raised portion, wherein the base portion is not recessed, and wherein the upper surface of the gap fill dielectric remains non-planar after reducing the height differential;
   depositing an interlayer dielectric overlying the gap fill dielectric; and
   forming an electrical contact to a selected location overlying the semiconductor substrate.

2. The method of claim 1 wherein:
   depositing a gap fill dielectric overlying a semiconductor substrate comprises depositing silicon oxide via a high aspect ratio polymer (HARP) process.

3. The method of claim 2 wherein depositing an interlayer dielectric overlying the gap fill dielectric comprises depositing silicon oxide via a plasma-deposition process using tetraethoxysilane (TEOS).

4. The method of claim 1 wherein:
   reducing the height differential of the upper surface of the gap fill dielectric comprises planarizing the raised portion, wherein the base portion is not planarized.

5. The method of claim 1 further comprising planarizing the interlayer dielectric to form the interlayer dielectric with a recessed planar surface.

6. The method of claim 1 wherein forming an electrical contact to a selected location on the semiconductor substrate comprises forming an electrical contact to a selected gate structure on the semiconductor substrate and forming an electrical contact to a contact region on the semiconductor substrate.

7. The method of claim 1 further comprising depositing a stressed layer overlying the semiconductor substrate, wherein depositing the gap fill dielectric overlying the semiconductor substrate comprises depositing the gap fill dielectric overlying the stressed layer.

8. The method of claim 1 wherein forming an electrical contact to a selected location on the semiconductor substrate comprises:
   etching a trench through the interlayer dielectric and the gap fill dielectric to expose the selected location;
   filling the trench with a conductive material.

9. The method of claim 8 further comprising:
   depositing additional dielectric overlying the electrical contact and the interlayer dielectric;
   etching a trench through the additional dielectric to expose the electrical contact; and
   forming an electrical interconnect in the trench and contact with the electrical contact.

10. A method for fabricating an integrated circuit, the method comprising:
    providing a semiconductor substrate with gate structures formed thereon;
    depositing a gap fill dielectric overlying the gate structures and the semiconductor substrate via a high aspect ratio polymer (HARP) process;
    planarizing the gap fill dielectric, wherein the gap fill dielectric remains covering the gate structures;
    depositing an interlayer dielectric overlying the gap fill dielectric; and
    forming an electrical contact to a selected gate structure.

11. The method of claim 10 wherein:
    depositing a gap fill dielectric overlying the gate structures and the semiconductor substrate comprises forming the gap fill dielectric with raised portions overlying the gate structures and with base portions; and
    planarizing the gap fill dielectric comprises selectively planarizing the raised portions, wherein the base portions are not planarized, and wherein an upper surface of the gap fill dielectric remains non-planar after planarizing the raised portions.

12. The method of claim 10 further comprising planarizing the interlayer dielectric to form the interlayer dielectric with a recessed planar surface.

13. The method of claim 10 wherein forming an electrical contact to a selected gate structure further comprises forming an electrical contact to a contact region on the semiconductor substrate.

14. The method of claim 10 further comprising depositing a stressed layer overlying the gate structures and the semiconductor substrate, wherein depositing the gap fill dielectric overlying the gate structures and the semiconductor substrate comprises depositing the gap fill dielectric overlying the stressed layer.

15. The method of claim 10 wherein:
    depositing a gap fill dielectric overlying the gate structures and the semiconductor substrate comprises depositing silicon oxide via a high aspect ratio polymer (HARP) process.

16. The method of claim 15 wherein depositing an interlayer dielectric overlying the gap fill dielectric comprises depositing silicon oxide via a plasma-deposition process using tetraethoxysilane (TEOS).

17. The method of claim 10 wherein forming an electrical contact to a selected gate structure comprises:
    etching a trench through the interlayer dielectric and the gap fill dielectric to expose the selected gate structure;
    filling the trench with a conductive material.

18. The method of claim 17 further comprising:
    depositing additional dielectric overlying the electrical contact and the interlayer dielectric;
    etching a trench through the additional dielectric to expose the electrical contact; and
    forming an electrical interconnect in the trench and contact with the electrical contact.

19. An integrated circuit comprising:
    a semiconductor substrate;
    a gate structure overlying the semiconductor substrate;
    a high aspect ratio polymer (HARP) silicon oxide gap fill dielectric overlying the gate structure and the semiconductor substrate;
    an interlayer dielectric overlying the gap fill dielectric; and
    a conductive contact in electrical contact with the gate structure, wherein the conductive contact extends through and is in physical contact with the interlayer dielectric and the gap fill dielectric.

20. The integrated circuit of claim 19 wherein the interlayer dielectric overlying the gap fill dielectric comprises tetraethoxysilane (TEOS) silicon oxide.

* * * * *